(12) United States Patent
Kato et al.

(10) Patent No.: US 11,682,719 B2
(45) Date of Patent: Jun. 20, 2023

(54) VERTICAL INSULATED GATE BIPOLAR TRANSISTOR (IGBT) WITH TWO TYPE CONTROL GATES

(71) Applicant: KABUSHIKI KAISHA TOSHIBA, Tokyo (JP)

(72) Inventors: Takahiro Kato, Yokohama Kanagawa (JP); Tatsunori Sakano, Shinagawa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/155,523

(22) Filed: Jan. 22, 2021

(65) Prior Publication Data

US 2021/0391452 A1 Dec. 16, 2021

(30) Foreign Application Priority Data

Jun. 10, 2020 (JP) .............................. JP2020-100696

(51) Int. Cl.
*H01L 29/739* (2006.01)
*H03K 19/003* (2006.01)
*H01L 29/423* (2006.01)

(52) U.S. Cl.
CPC .... *H01L 29/7395* (2013.01); *H01L 29/42368* (2013.01); *H01L 29/7397* (2013.01); *H03K 19/00307* (2013.01)

(58) Field of Classification Search
CPC ........... H01L 29/7395; H01L 29/42368; H01L 29/7397; H01L 29/42364
See application file for complete search history.

(56) References Cited

U.S. PATENT DOCUMENTS 6,342,709 B1 * 1/2002 Sugawara ........... H01L 29/7813
257/139
8,614,483 B2 12/2013 Tanabe et al.
(Continued)

FOREIGN PATENT DOCUMENTS

JP 2012-64686 A 3/2012
JP 2014-197702 A 10/2014
(Continued)

OTHER PUBLICATIONS

Sandow et al., "IGBT with superior long-term switching behavior by asymmetric trench oxide," Proceedings of the 30$^{th}$ International Symposium on Power Semiconductor Devices and ICs (May 13-17, 2018), pp. 24-27.
(Continued)

*Primary Examiner* — Khaja Ahmad
(74) *Attorney, Agent, or Firm* — Finnegan, Henderson, Farabow, Garrett & Dunner, LLP (57) ABSTRACT

According to one embodiment, a semiconductor device includes first, and second conductive members, a first electrode including first and second electrode regions, a second electrode electrically connected to a first semiconductor film portion, a first semiconductor region including first to fourth partial regions, a second semiconductor region including the first semiconductor film portion, a third semiconductor region including a first semiconductor layer portion, a fourth semiconductor region provided between the first electrode and the first semiconductor region, and a first insulating member including insulating portions. The first partial region is between the first electrode region and the first conductive member. The second partial region is between the second electrode region and the second conductive member. The third partial region is between the first and second partial regions and between the first electrode and the
(Continued)

fourth partial region. The fourth partial region is between the first and second conductive members.

16 Claims, 10 Drawing Sheets

(56) References Cited

U.S. PATENT DOCUMENTS

| | | | | |
|---|---|---|---|---|
| 2008/0197442 | A1* | 8/2008 | Hirler | H01L 29/7813 |
| | | | | 438/587 |
| 2010/0193835 | A1* | 8/2010 | Hshieh | H01L 29/41708 |
| | | | | 257/E21.385 |
| 2012/0061724 | A1 | 3/2012 | Ogura | |
| 2013/0065384 | A1* | 3/2013 | Hiyoshi | H01L 21/3065 |
| | | | | 257/E21.409 |
| 2014/0320193 | A1* | 10/2014 | Asahara | H01L 29/407 |
| | | | | 257/330 |
| 2015/0091055 | A1 | 4/2015 | Gejo et al. | |
| 2015/0144994 | A1* | 5/2015 | Sung | H01L 29/7397 |
| | | | | 257/139 |
| 2016/0093719 | A1* | 3/2016 | Kobayashi | H01L 29/42368 |
| | | | | 438/270 |
| 2016/0336404 | A1* | 11/2016 | Naito | H01L 29/0696 |
| 2017/0141677 | A1* | 5/2017 | Hashimoto | H01L 29/7397 |
| 2017/0250269 | A1* | 8/2017 | Sumitomo | H01L 29/407 |
| 2018/0108738 | A1 | 4/2018 | Naito | |
| 2018/0145137 | A1* | 5/2018 | Yamamoto | H01L 29/0623 |
| 2018/0175149 | A1* | 6/2018 | Takaya | H01L 29/4236 |
| 2019/0123186 | A1 | 4/2019 | Philippou et al. | |
| 2019/0181254 | A1 | 6/2019 | Nagata | |
| 2019/0296133 | A1 | 9/2019 | Iwakaji et al. | |
| 2020/0395471 | A1* | 12/2020 | Takeuchi | H01L 29/7393 |
| 2021/0091217 | A1* | 3/2021 | Miyoshi | H01L 25/16 |

FOREIGN PATENT DOCUMENTS

| | | |
|---|---|---|
| JP | 2015-72950 A | 4/2015 |
| JP | 2016-72482 A | 5/2016 |
| JP | 2016-115847 A | 6/2016 |
| JP | 2016-162855 A | 9/2016 |
| JP | 2018-190948 A | 11/2018 |
| JP | 2019-91892 A | 6/2019 |
| JP | 2019-102759 A | 6/2019 |
| JP | 2019-169597 A | 10/2019 |
| WO | WO 2018/215729 A1 | 11/2018 |
| WO | WO-2019163478 A1 * | 8/2019 ............ H01L 25/16 |

OTHER PUBLICATIONS

Alatise et al., "Repetitive Avalanche Cycling of Low-Voltage Power Trench n-MOSFETs," IEEE (2010), pp. 273-276.

* cited by examiner

VERTICAL INSULATED GATE BIPOLAR TRANSISTOR (IGBT) WITH TWO TYPE CONTROL GATES

CROSS-REFERENCE TO RELATED APPLICATIONS

This application is based upon and claims the benefit of priority from Japanese Patent Application No. 2020-100696, filed on Jun. 10, 2020; the entire contents of which are incorporated herein by reference.

FIELD

Embodiments of the invention generally relate to a semiconductor device.

BACKGROUND

It is desirable for a semiconductor device to have stable operations.

DETAILED DESCRIPTION

According to one embodiment, a semiconductor device includes a first conductive member, a second conductive member, a first electrode, a second electrode, a first semiconductor region, a second semiconductor region, a third semiconductor region, a fourth semiconductor region, and a first insulating member. The first electrode includes a first electrode region and a second electrode region. A first direction from the first electrode region toward the first conductive member crosses a second direction from the first electrode region toward the second electrode region. A direction from the second electrode region toward the second conductive member is along the first direction. The first semiconductor region includes a first partial region, a second partial region, a third partial region, and a fourth partial region. The first semiconductor region is of a first conductivity type. The first partial region is between the first electrode region and the first conductive member. The second partial region is between the second electrode region and the second conductive member. The third partial region is between the first partial region and the second partial region in the second direction. The third partial region is between the first electrode and the fourth partial region in the first direction. The fourth partial region is between the first conductive member and the second conductive member. The second semiconductor region includes a first semiconductor film portion. The second semiconductor region is of the first conductivity type. The fourth partial region is between the third partial region and the first semiconductor film portion in the first direction. The third semiconductor region includes a first semiconductor layer portion. The third semiconductor region is of a second conductivity type. The first semiconductor layer portion is between the fourth partial region and the first semiconductor film portion in the first direction. The fourth semiconductor region is provided between the first electrode and the first semiconductor region. The fourth semiconductor region is of the second conductivity type. The second electrode is electrically connected to the first semiconductor film portion. The first insulating member includes a first insulating portion, a second insulating portion, a third insulating portion, and a fourth insulating portion. The first insulating portion is between the first partial region and the first conductive member in the first direction. The second insulating portion is between the first conductive member and the fourth partial region in the second direction. The third insulating portion is between the first conductive member and a portion of the first semiconductor layer portion in the second direction. The fourth insulating portion is between the first conductive member and an other portion of the fourth partial region in the second direction. The fourth insulating portion is between the second insulating portion and the third insulating portion in the first direction. A second thickness along the second direction of the second insulating portion is greater than a third thickness along the second direction of the third insulating portion. A fourth thickness along the second direction of the fourth insulating portion is greater than the third thickness. The first conductive member is set to an off-state before the second conductive member is set to the off-state.

According to one embodiment, a semiconductor device includes a first conductive member, a second conductive member, a first electrode, a second electrode, a first semiconductor region, a second semiconductor region, a third semiconductor region, a fourth semiconductor region, a fifth semiconductor region, and a first insulating member. The first electrode includes a first electrode region and a second electrode region. A first direction from the first electrode region toward the first conductive member crosses a second direction from the first electrode region toward the second electrode region. A direction from the second electrode region toward the second conductive member is along the first direction. The first semiconductor region includes a first partial region, a second partial region, a third partial region, and a fourth partial region. The first semiconductor region is of a first conductivity type. The first partial region is between the first electrode region and the first conductive member. The second partial region is between the second electrode region and the second conductive member. The third partial region is between the first partial region and the second partial region in the second direction. The third partial region is between the first electrode and the fourth partial region in the first direction. The fourth partial region is between the first conductive member and the second conductive member. The second semiconductor region includes a first semiconductor film portion. The second semiconductor region is of the first conductivity type. The fourth partial region is between the third partial region and the first semiconductor film portion in the first direction. The third semiconductor region includes a first semiconductor layer portion. The third semiconductor region is of a second conductivity type. The first semiconductor layer portion is between the fourth partial region and the first semiconductor film portion in the first direction. The fourth semiconductor region is provided between the first electrode and the first semiconductor region. The fourth semiconductor region is of the second conductivity type. The fifth semiconductor region is of the second conductivity type. At least a portion of the fifth semiconductor region is provided between the first partial region and the first conductive member. The second electrode is electrically connected to the first semiconductor film portion. The first insulating member includes a first insulating portion, a second insulating portion, a third insulating portion, and a fourth insulating portion. The first insulating portion is between the first partial region and the first conductive member in the first direction. The second insulating portion is between the first conductive member and the fourth partial region in the second direction. The third insulating portion is between the first conductive member and a portion of the first semiconductor layer portion in the second direction. The fourth insulating portion is between the first conductive member and an other portion of the fourth partial region in the second direction. The fourth insulating portion is between the second insulating portion and the third insulating portion in the first direction. A second thickness along the second direction of the second insulating portion is greater than a third thickness along the second direction of the third insulating portion. A fourth thickness along the second direction of the fourth insulating portion is greater than the third thickness.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 1:
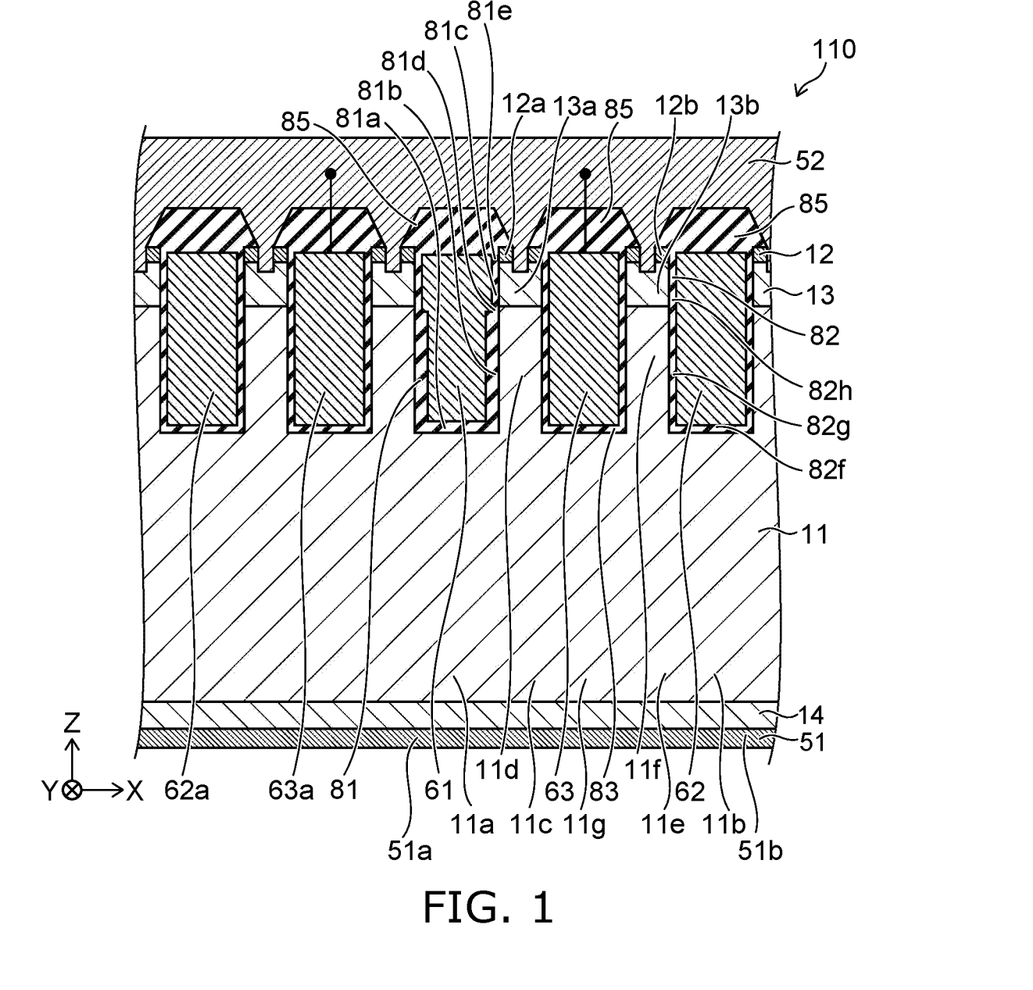
FIG. 1 is a schematic cross-sectional view illustrating a semiconductor device according to a first embodiment.

FIG. 1 is a schematic cross-sectional view illustrating a semiconductor device according to a first embodiment.

As shown in FIG. 1, the semiconductor device 110 according to the embodiment includes a first conductive member 61, a second conductive member 62, a first electrode 51, a second electrode 52, a first semiconductor region 11, a second semiconductor region 12, a third semiconductor region 13, a fourth semiconductor region 14, and a first insulating member 81.

The first electrode 51 includes a first electrode region 51a and a second electrode region 51b. A first direction from the first electrode region 51a toward the first conductive member 61 crosses a second direction from the first electrode region 51a toward the second electrode region 51b.

The first direction is taken as a Z-axis direction. One direction perpendicular to the Z-axis direction is taken as an X-axis direction. A direction perpendicular to the Z-axis direction and the X-axis direction is taken as a Y-axis direction. The second direction is, for example, the X-axis direction.

The direction from the second electrode region 51b toward the second conductive member 62 is along the first direction (the Z-axis direction).

The first semiconductor region 11 includes a first partial region 11a, a second partial region 11b, a third partial region 11c, and a fourth partial region 11d. The first semiconductor region 11 is of a first conductivity type.

The first partial region 11a is between the first electrode region 51a and the first conductive member 61 in the Z-axis direction. The second partial region 11b is between the second electrode region 51b and the second conductive member 62 in the Z-axis direction. The third partial region 11c is between the first partial region 11a and the second partial region 11b in the second direction (e.g., the X-axis direction). The third partial region 11c is between the first electrode region 51a and the fourth partial region 11d in the first direction (the Z-axis direction). The fourth partial region 11d is between the first conductive member 61 and the second conductive member 62.

The second semiconductor region 12 includes a first semiconductor film portion 12a. The second semiconductor region 12 is of the first conductivity type. The fourth partial region 11d is between the third partial region 11c and the first semiconductor film portion 12a in the first direction (the Z-axis direction).

The third semiconductor region 13 includes a first semiconductor layer portion 13a. The third semiconductor region 13 is of a second conductivity type.

For example, the first conductivity type is an n-type, and the second conductivity type is a p-type. In the embodiment, the first conductivity type may be the p-type, and the second conductivity type may be the n-type. Hereinbelow, the first conductivity type is taken to be the n-type, and the second conductivity type is taken to be the p-type.

The first semiconductor layer portion 13a of the third semiconductor region 13 is between the fourth partial region 11d and the first semiconductor film portion 12a in the first direction (the Z-axis direction).

The fourth semiconductor region 14 is located between the first electrode 51 and the first semiconductor region 11. The fourth semiconductor region 14 is of the second conductivity type (e.g., the p-type).

The second electrode 52 is electrically connected to the first semiconductor film portion 12a. In the example, the conductive members described above and the semiconductor regions described above are located between the first electrode 51 and the second electrode 52.

The first insulating member 81 includes a first insulating portion 81a, a second insulating portion 81b, a third insulating portion 81c, and a fourth insulating portion 81d. The first insulating portion 81a is between the first partial region 11a and the first conductive member 61 in the first direction (the Z-axis direction). The second insulating portion 81b is between the first conductive member 61 and the fourth partial region 11d in the second direction (e.g., the X-axis direction). The third insulating portion 81c is between the first conductive member 61 and a portion of the first semiconductor layer portion 13a in the second direction (e.g., the X-axis direction).

The fourth insulating portion 81d is between the first conductive member 61 and another portion of the fourth partial region 11d in the second direction (e.g., the X-axis direction). The fourth insulating portion 81d is between the second insulating portion 81b and the third insulating portion 81c in the first direction (the Z-axis direction).

In the example, the first insulating member 81 further includes a fifth insulating portion 81e. The fifth insulating portion 81e is between the first conductive member 61 and the first semiconductor film portion 12a. The first insulating member 81 electrically insulates between the first conductive member 61 and the semiconductor regions.

For example, the first electrode 51 is a collector electrode. The second electrode 52 is an emitter electrode. The first conductive member 61 and the second conductive member 62 function as gate electrodes. The first insulating member 81 functions as a gate insulating film. A current that flows between the first electrode 51 and the second electrode 52 can be controlled according to the potentials of the first and second conductive members 61 and 62. The semiconductor device 110 is, for example, an IGBT (Insulated Gate Bipolar Transistor).

In the embodiment as described below, the thickness of the second insulating portion 81b and the thickness of the fourth insulating portion 81d are greater than the thickness of the third insulating portion 81c. The thickness of the first insulating member 81 is modified according to the location. As described below, the characteristics of the semiconductor device 110 can be stabilized thereby. For example, high reliability is easily obtained.

In the example as shown in FIG. 1, the first semiconductor region 11 further includes a fifth partial region 11e and a sixth partial region 11f. The fifth partial region 11e is between the third partial region 11c and the second partial region 11b in the second direction (e.g., the X-axis direction). The second semiconductor region 12 further includes a second semiconductor film portion 12b. The third semiconductor region 13 further includes a second semiconductor layer portion 13b. The sixth partial region 11f is between the fifth partial region 11e and the second semiconductor film portion 12b in the first direction (the Z-axis direction). The second semiconductor layer portion 13b is between the sixth partial region 11f and the second semiconductor film portion 12b in the first direction (the Z-axis direction).

The sixth partial region 11f is between the fourth partial region 11d and a portion of the second conductive member 62 in the second direction (e.g., the X-axis direction). The second semiconductor layer portion 13b is between the first semiconductor layer portion 13a and a portion of the second conductive member 62 in the second direction (the X-axis direction). The second semiconductor film portion 12b is between the first semiconductor film portion 12a and another portion of the second conductive member 62 in the second direction (the X-axis direction).

As shown in FIG. 1, the semiconductor device 110 further includes a second insulating member 82. The second insulating member 82 includes a sixth insulating portion 82f, a seventh insulating portion 82g, and an eighth insulating portion 82h. The sixth insulating portion 82f is between the second partial region 11b and the second conductive member 62 in the first direction (the Z-axis direction). The seventh insulating portion 82g is between the sixth partial region 11f and the second conductive member 62 in the second direction (e.g., the X-axis direction). The eighth insulating portion 82h is between the second semiconductor layer portion 13b and the second conductive member 62 in the second direction (e.g., the X-axis direction). For example, the second insulating member 82 electrically insulates between the second conductive member 62 and the semiconductor regions.

In the example as shown in FIG. 1, the semiconductor device 110 further includes a third conductive member 63 and a third insulating member 83. The third conductive member 63 is electrically connected to the second electrode 52. The first semiconductor region 11 further includes a seventh partial region 11g. The seventh partial region 11g is between the third partial region 11c and the fifth partial region 11e in the second direction (e.g., the X-axis direction). The direction from the seventh partial region 11g toward the third conductive member 63 is along the first direction (the Z-axis direction). At least a portion of the third insulating member 83 is between the seventh partial region 11g and the third conductive member 63. For example, the third insulating member 83 electrically insulates between the third conductive member 63 and the semiconductor regions.

As shown in FIG. 1, the third conductive member 63 is between the fourth partial region 11d and the sixth partial region 11f in the second direction (e.g., the X-axis direction), between the first semiconductor layer portion 13a and the second semiconductor layer portion 13b in the second direction, and between the first semiconductor film portion 12a and the second semiconductor film portion 12b in the second direction.

Another second conductive member 62a and another third conductive member 63a are provided in the example. The first conductive member 61 is between the other second conductive member 62a and the second conductive member 62 in the X-axis direction. The other third conductive member 63a is between the other second conductive member 62a and the first conductive member 61. The third conductive member 63 is between the first conductive member 61 and the second conductive member 62.

In the example, the semiconductor device 110 includes an insulating part 85. The insulating part 85 is between the first conductive member 61 and the second electrode 52, between the second conductive member 62 and the second electrode 52, and between the third conductive member 63 and the second electrode 52.

The third conductive member 63 is, for example, a "dummy electrode" and functions as a member that relaxes the concentration of the electric field. For example, the first conductive member 61 and the second conductive member 62 function as gate electrodes. For example, the potential of the first conductive member 61 and the potential of the second conductive member 62 can be controlled at different timing. For example, such a control can be performed by a controller described below.

Figure 2:
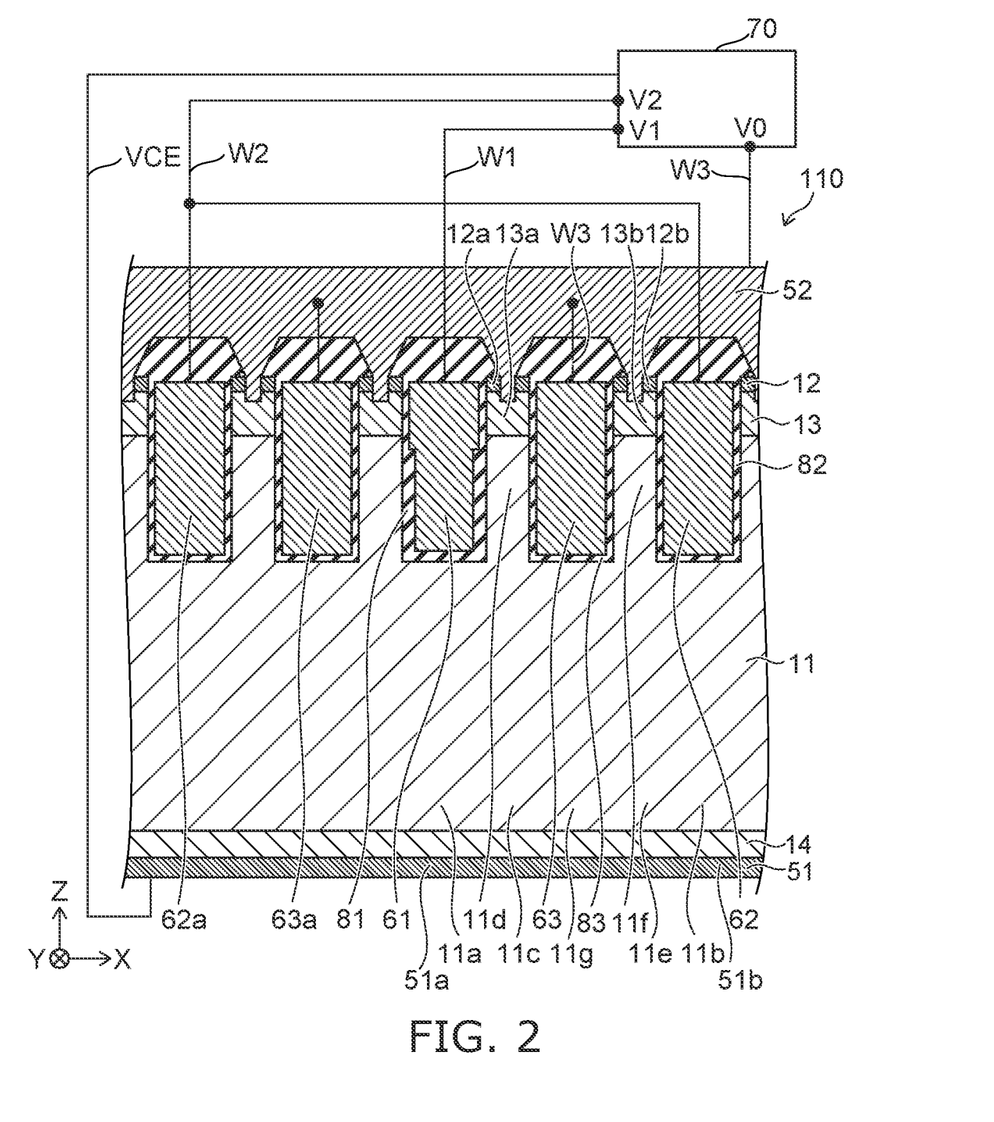
FIG. 2 is a schematic view illustrating the semiconductor device according to the first embodiment.

FIG. 2 is a schematic view illustrating the semiconductor device according to the first embodiment.

Figure 3:
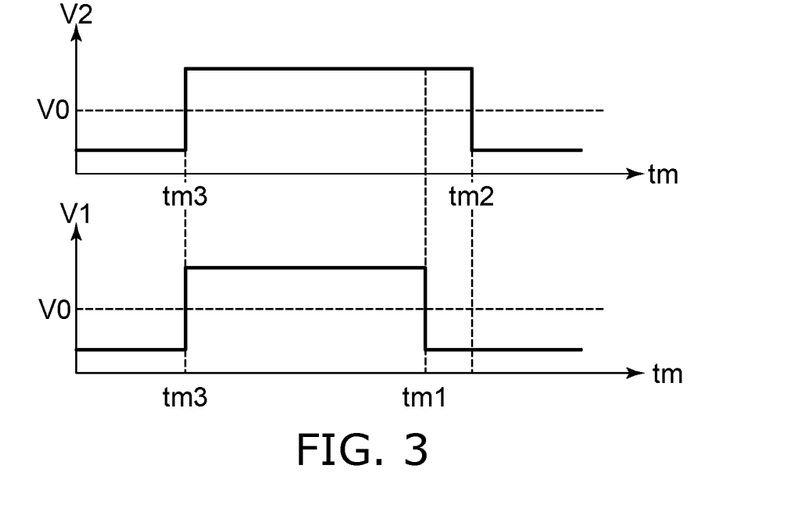
FIG. 3 is a schematic view illustrating an operation of the semiconductor device according to the first embodiment.

FIG. 3 is a schematic view illustrating an operation of the semiconductor device according to the first embodiment.

As shown in FIG. 2, a controller 70 may be provided in the semiconductor device 110. The controller 70 is electrically connected to the first conductive member 61 via wiring W1. The controller 70 is electrically connected to the second conductive member 62 (and the other second conductive member 62) via wiring W2. The third conductive member 63 (and the other third conductive member 63a) are electrically connected to the second electrode 52 by wiring W3. The controller 70 is electrically connected to the first and second electrodes 51 and 52.

The controller 70 sets the second electrode 52 to a reference potential V0. The reference potential V0 is, for example, a ground potential. The controller 70 applies a voltage VCE to the first electrode 51. The controller 70 applies a voltage V1 to the first conductive member 61. The controller 70 applies a voltage V2 to the second conductive member 62.

FIG. 3 illustrates the voltage V1 and the voltage V2. The horizontal axis of FIG. 3 is a time tm. For example, the voltage V1 and the voltage V2 change from negative (the off-state) to positive (the on-state) at a time tm3. The voltage V1 is set to negative (the off-state) at a time tm1 after the time tm3. The voltage V2 is set to negative (the off-state) at a time tm2 after the time tm1. The potential of the first conductive member 61 or the second conductive member 62 in the off-state is less than the potential of the first conductive member 61 or the second conductive member 62 in the on-state. For example, the potential of the first conductive member 61 or the second conductive member 62 in the off-state is less than the potential (the reference potential V0) of the second electrode 52.

Thus, in one example of the semiconductor device 110, the first conductive member 61 is set to the off-state before the second conductive member 62 is set to the off-state. For example, the controller 70 sets the first conductive member 61 to the off-state before setting the second conductive member 62 to the off-state. By such an operation, for example, the loss when the semiconductor device 110 is set to the off-state can be reduced.

When the first conductive member 61 is turned off before the second conductive member 62, a dynamic avalanche phenomenon easily occurs around the first insulating member 81. Hot holes that are increased by the occurrence of the dynamic avalanche phenomenon pass through the interface between the first insulating member 81 and the semiconductor regions and travel toward the second electrode 52 via the first conductive member 61. When many holes are trapped in the interface between the first insulating member 81 and the semiconductor regions or in trapping levels inside the first insulating member 81, the characteristics of the MOS capacitor formed of the first conductive member 61, the first insulating member 81, and the semiconductor members degrade, and the characteristics of the semiconductor device 110 change. For example, there are cases where the switching time extends. For example, when turned on, there are cases where the change of the current with respect to the time increases.

Thus, there are cases where the characteristics of the semiconductor device 110 at turn-off change.

In the embodiment, the thickness of the first insulating member 81 is modified according to the location. The characteristics of the semiconductor device can be stabilized thereby.

Figure 4:
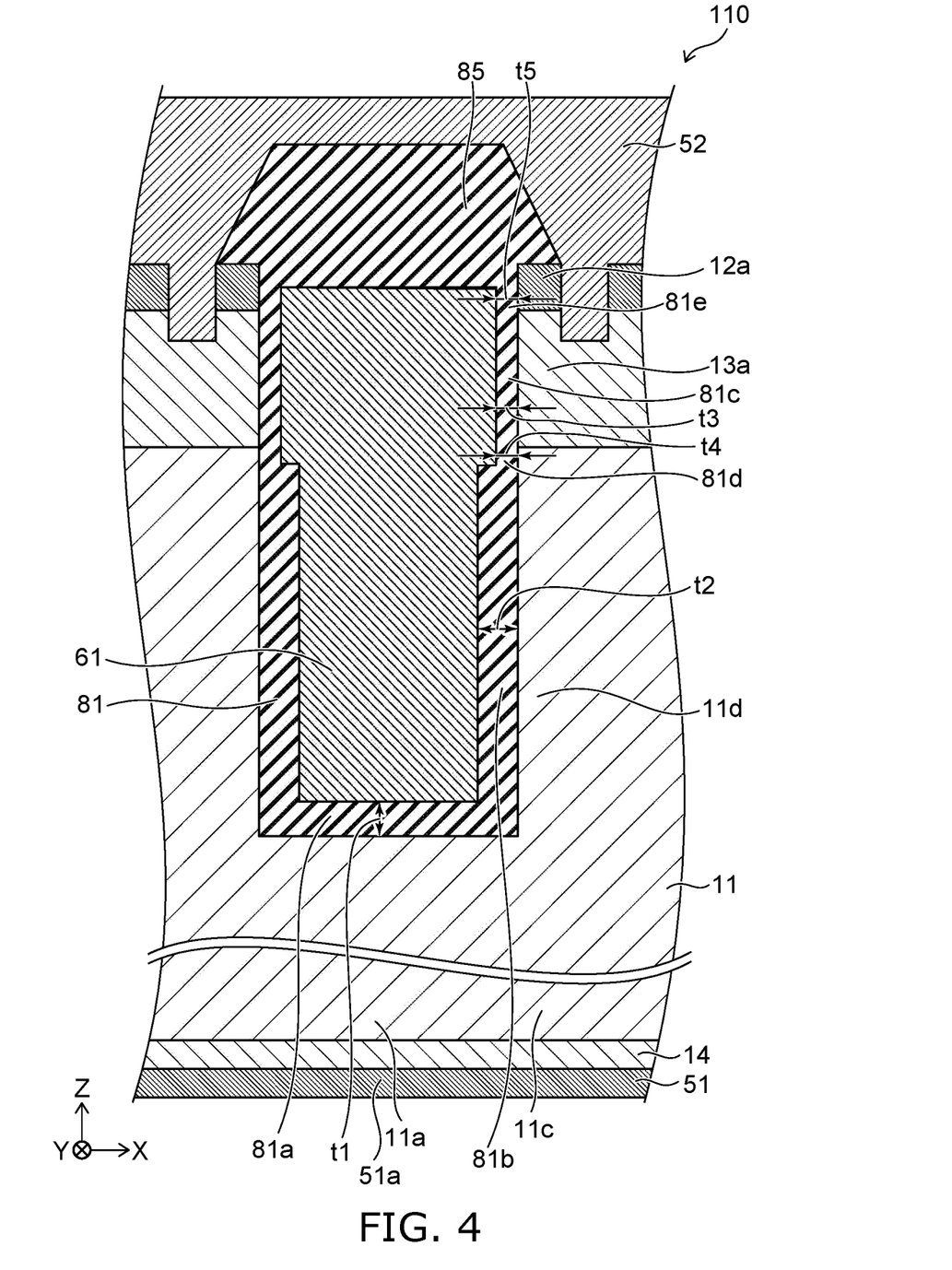
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, the thickness along the second direction (e.g., the X-axis direction) of the second insulating portion 81b is taken as a second thickness t2. The thickness along the second direction (e.g., the X-axis direction) of the third insulating portion 81c is taken as a third thickness t3. The second thickness t2 is greater than the third thickness t3. The thickness along the second direction (e.g., the X-axis direction) of the fourth insulating portion 81d is taken as a fourth thickness t4. The fourth thickness t4 is greater than the third thickness t3. The characteristics of the semiconductor device 110 are stabilized by such thicknesses.

For example, it may be considered to increase the thickness of the entire first insulating member 81, and to set the third thickness t3 of the third insulating portion 81c to be as thick as the other portions. Thereby, it would be expected that the hot holes can be prevented from passing through the first insulating member 81. However, the operating characteristics (e.g., the threshold voltage, etc.) of the semiconductor device are unfavorably affected when the thickness of the entire first insulating member 81 is thick and the third thickness t3 of the third insulating portion 81c also is thick.

Conversely, in the embodiment, the thicknesses of the other portions of the first insulating member 81 are set to be thick while maintaining the third thickness t3 of the third insulating portion 81c at a value appropriate for obtaining the desired operating characteristics. Thereby, for example, the hot holes can be prevented from passing through the second and fourth insulating portions 81b and 81d. For example, the degradation of the second and fourth insulating portions 81b and 81d can be suppressed. Stable characteristics are easily obtained thereby. According to the embodiment, a semiconductor device can be provided in which stable operations are possible.

In the embodiment, the change of the characteristics can be suppressed particularly when turning off the first conductive member 61 before the second conductive member 62.

In the embodiment, for example, the second thickness t2 is not less than 1.2 times the third thickness t3. The fourth thickness t4 is not less than 1.2 times the third thickness t3. Stable characteristics are easily maintained thereby.

As shown in FIG. 4, the thickness along the first direction (the Z-axis direction) of the first insulating portion 81a is taken as a first thickness t1. In the embodiment, the first thickness t1 is greater than the third thickness t3. The degradation of the characteristics of the first insulating portion 81a is easily suppressed thereby. More stable characteristics are obtained. For example, the first thickness t1 is not less than 1.2 times the third thickness t3.

Figure 5:
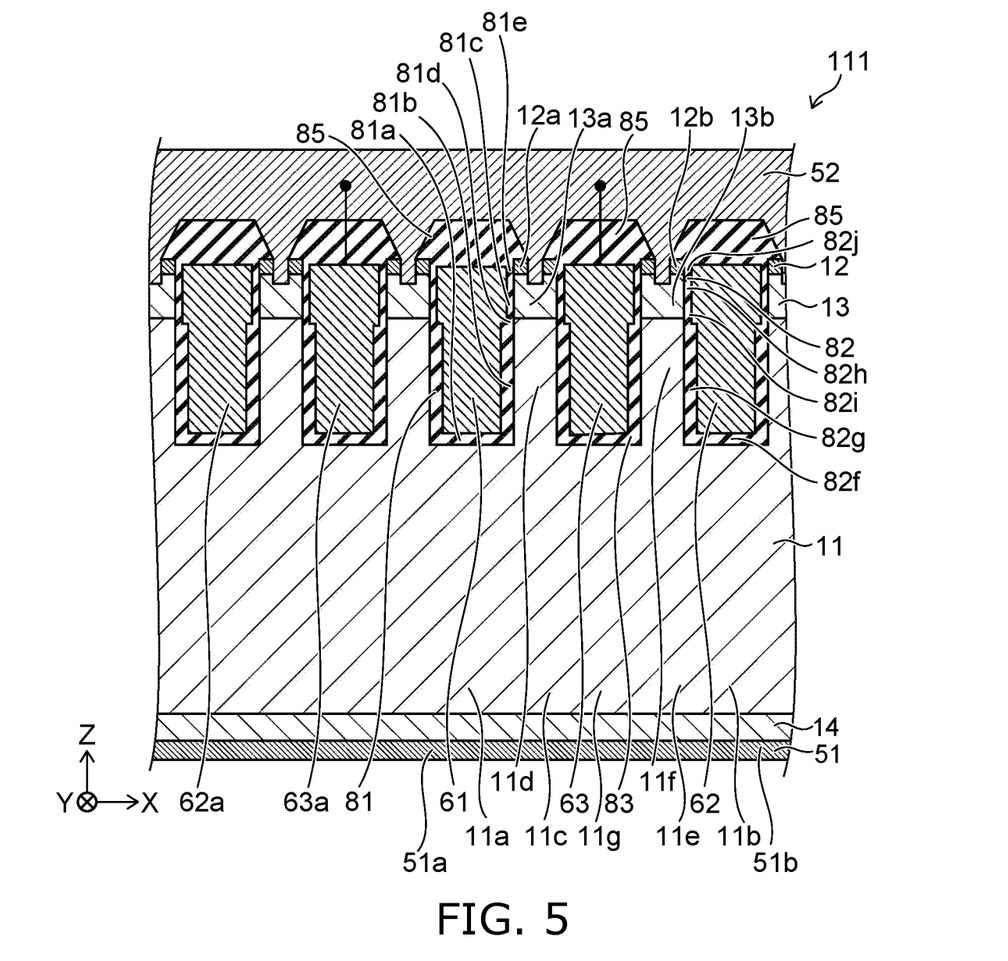
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, the thickness of the second insulating member 82 is modified according to the location in the semiconductor device 111 according to the embodiment. In the example, the thickness of the third insulating member 83 also is modified according to the location. Otherwise, the configuration of the semiconductor device 111 is similar to the configuration of the semiconductor device 110. Examples of the second and third insulating members 82 and 83 of the semiconductor device 111 will now be described.

Figure 6:
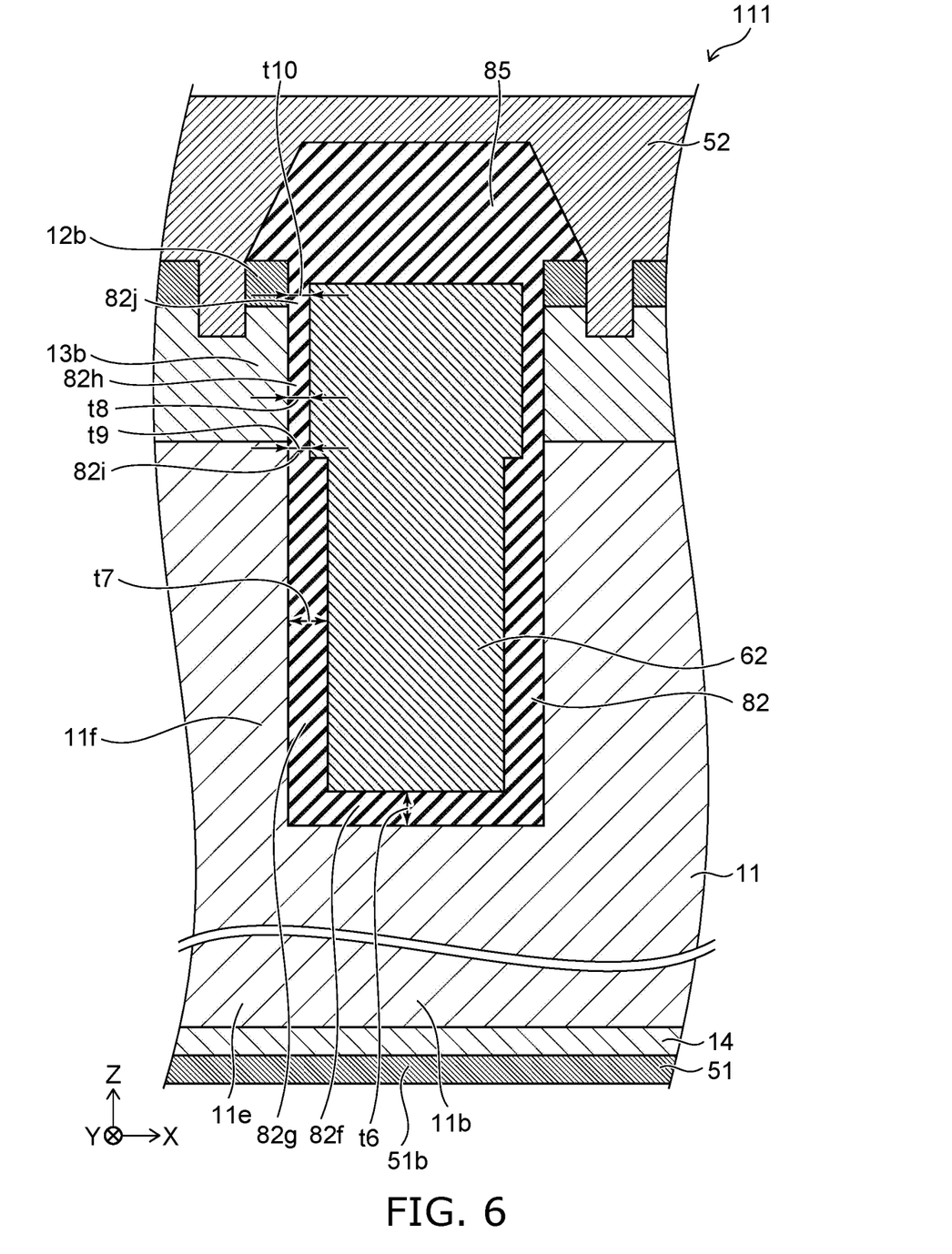
FIG. 6 is a schematic cross-sectional view illustrating the semiconductor device according to the first embodiment.

FIG. 6 is a schematic cross-sectional view illustrating the semiconductor device according to the first embodiment.

As shown in FIG. 6, the second insulating member 82 includes a ninth insulating portion 82i in addition to the sixth, seventh, and eighth insulating portions 82f, 82g, and 82h. The ninth insulating portion 82i is between the seventh insulating portion 82g and the eighth insulating portion 82h in the first direction (the Z-axis direction). The ninth insulating portion 82i is between the second conductive member 62 and a portion of the sixth partial region 11f in the second direction (e.g., the X-axis direction).

The thickness along the second direction (the X-axis direction) of the seventh insulating portion 82g is taken as a seventh thickness t7. The thickness along the second direction of the eighth insulating portion 82h is taken as an eighth thickness t8. The seventh thickness t7 is greater than the eighth thickness t8. The thickness along the second direction of the ninth insulating portion 82i is taken as a ninth thickness t9. The ninth thickness t9 is greater than the eighth thickness t8.

For example, the degradation of the seventh and eighth insulating portions 82g and 82h can be suppressed. The manufacturing is easy because the configuration of the second insulating member 82 is similar to that of the first insulating member 81.

For example, a sixth thickness t6 along the first direction (the Z-axis direction) of the sixth insulating portion 82f is greater than the eighth thickness t8. The degradation of the sixth insulating portion 82f can be suppressed.

In the semiconductor device 111, the second insulating member 82 may include a tenth insulating portion 82j. The tenth insulating portion 82j is between the second semiconductor film portion 12b and the second conductive member 62.

In the semiconductor device 111 as shown in FIG. 5, the configuration of the thickness of the third insulating member 83 may be similar to the configuration of the thickness of the first insulating member 81. The manufacturing is easy because the configuration of the third insulating member 83 is similar to that of the first insulating member 81.

In the semiconductor device 110 or 111, the concentration of the first-conductivity-type impurity in the second semiconductor region 12 is greater than the concentration of the first-conductivity-type impurity in the first semiconductor region 11. The carrier concentration of the first conductivity type in the second semiconductor region 12 is greater than the carrier concentration of the first conductivity type in the first semiconductor region 11. The first semiconductor region 11 is, for example, an n⁻-layer or an n-layer. The second semiconductor region 12 is, for example, an n⁺-layer.

In the semiconductor device 110 or 111, the concentration of the first-conductivity-type impurity in the first semiconductor region 11 is, for example, not less than $1\times10^{12}$ cm$^{-3}$ and not more than $1\times10^{15}$ cm$^{-3}$. The concentration of the first-conductivity-type impurity in the second semiconductor region 12 is, for example, not less than $1\times10^{19}$ cm$^{-3}$ and not more than $1\times10^{22}$ cm$^{-3}$. The concentration of the second-conductivity-type impurity in the third semiconductor region 13 is, for example, not less than $1\times10^{15}$ cm$^{-3}$ and not more than $1\times10^{18}$ cm$^{-3}$. The concentration of the second-conductivity-type impurity in the fourth semiconductor region 14 is, for example, not less than $1\times10^{16}$ cm$^{-3}$ and not more than $1\times10^{19}$ cm$^{-3}$.

In the semiconductor device 110 or 111, the carrier concentration of the first conductivity type in the first semiconductor region 11 is, for example, not less than $1\times10^{12}$ cm$^{-3}$ and not more than $1\times10^{15}$ cm$^{-3}$. The carrier concentration of the first conductivity type in the second semiconductor region 12 is, for example, not less than $1\times10^{19}$ cm$^{-3}$ and not more than $1\times10^{22}$ cm$^{-3}$. The carrier concentration of the second conductivity type in the third semiconductor region 13 is, for example, not less than $1\times10^{15}$ cm$^{-3}$ and not more than $1\times10^{18}$ cm$^{-3}$. The carrier concentration of the second conductivity type in the fourth semiconductor region 14 is, for example, not less than $1\times10^{16}$ cm$^{-3}$ and not more than $1\times10^{19}$ cm$^{-3}$.

Second Embodiment

Figure 7:
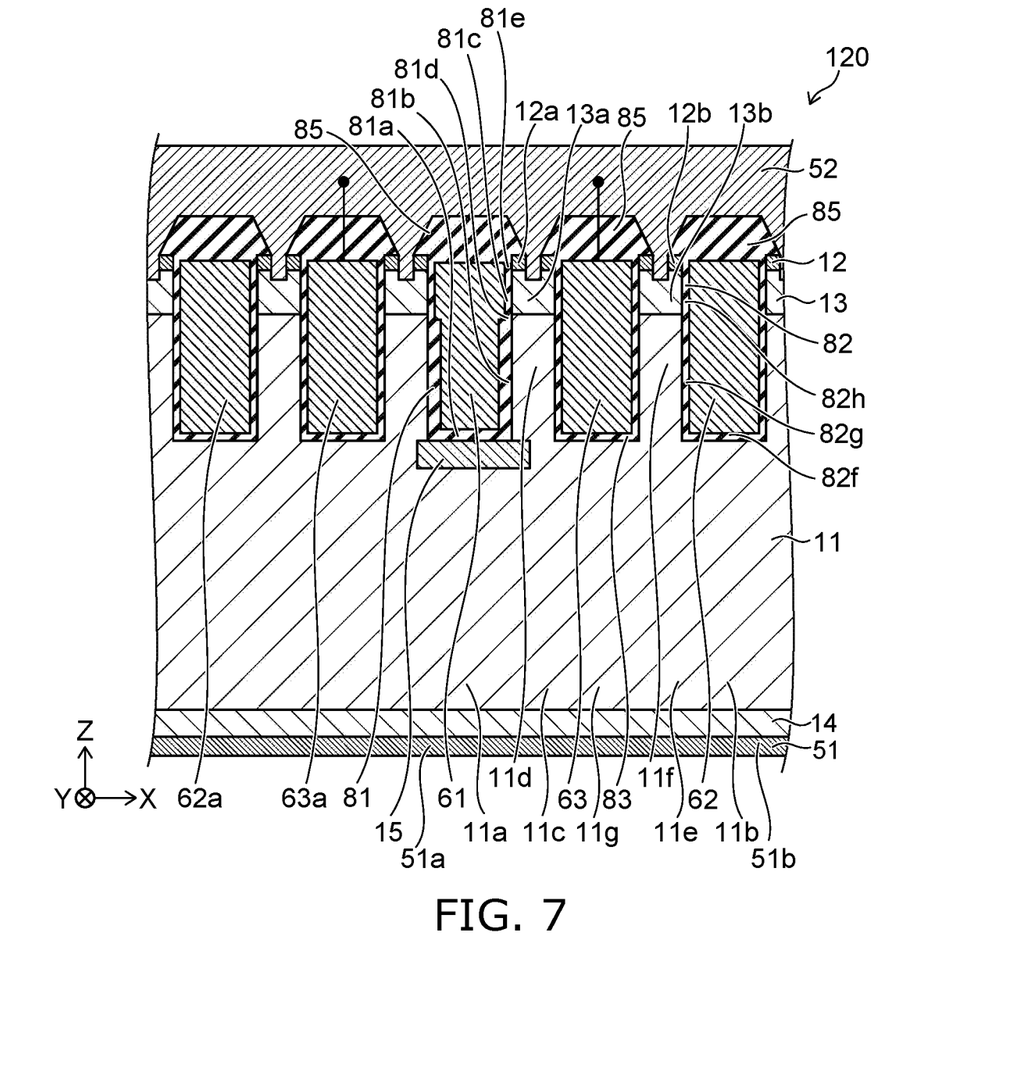
FIG. 7 is a schematic cross-sectional view illustrating a semiconductor device according to a second embodiment.

FIG. 7 is a schematic cross-sectional view illustrating a semiconductor device according to a second embodiment.

As shown in FIG. 7, the semiconductor device 120 according to the embodiment includes a fifth semiconductor region 15 in addition to the first conductive member 61, the second conductive member 62, the first electrode 51, the second electrode 52, the first semiconductor region 11, the second semiconductor region 12, the third semiconductor region 13, the fourth semiconductor region 14, and the first insulating member 81. Otherwise, the configuration of the semiconductor device 120 is similar to the configuration of the semiconductor device 110.

The fifth semiconductor region 15 is of the second conductivity type (e.g., the p-type). At least a portion of the fifth semiconductor region 15 is located between the first partial region 11a and the first conductive member 61 in the Z-axis direction. At least a portion of the fifth semiconductor region 15 is located between the first partial region 11a and the first insulating portion 81a in the Z-axis direction. For example, at least a portion of the fifth semiconductor region 15 contacts the first insulating portion 81a.

By providing the fifth semiconductor region 15, for example, the concentration of the electric field in the first insulating portion 81a can be relaxed. The degradation of the first insulating portion 81a can be suppressed. A semiconductor device can be provided in which stable operations are possible.

In the semiconductor device 120, the concentration of the second-conductivity-type impurity in the fifth semiconductor region 15 is, for example, not less than $1\times10^{13}$ cm$^{-3}$ and not more than $1\times10^{16}$ cm$^{-3}$. The carrier concentration of the second conductivity type in the fifth semiconductor region 15 is, for example, not less than $1\times10^{13}$ cm$^{-3}$ and not more than $1\times10^{16}$ cm$^{-3}$.

In the example, at least a portion of the fifth semiconductor region 15 is between the third partial region 11c and the fourth partial region 11d in the first direction (the Z-axis direction). The fifth semiconductor region 15 includes a portion that protrudes from the sidewall of the first insulating member 81 in the X-axis direction. The concentration of the electric field at the corner portion of the first insulating member 81 can be effectively suppressed by such a fifth semiconductor region 15.

As shown in FIG. 7, such a fifth semiconductor region 15 may not be under the second conductive member 62 or under the third conductive member 63. For example, a portion of the second insulating member 82 contacts the second partial region 11b between the second partial region 11b and the second conductive member 62 in the first direction (the Z-axis direction).

Figure 8:
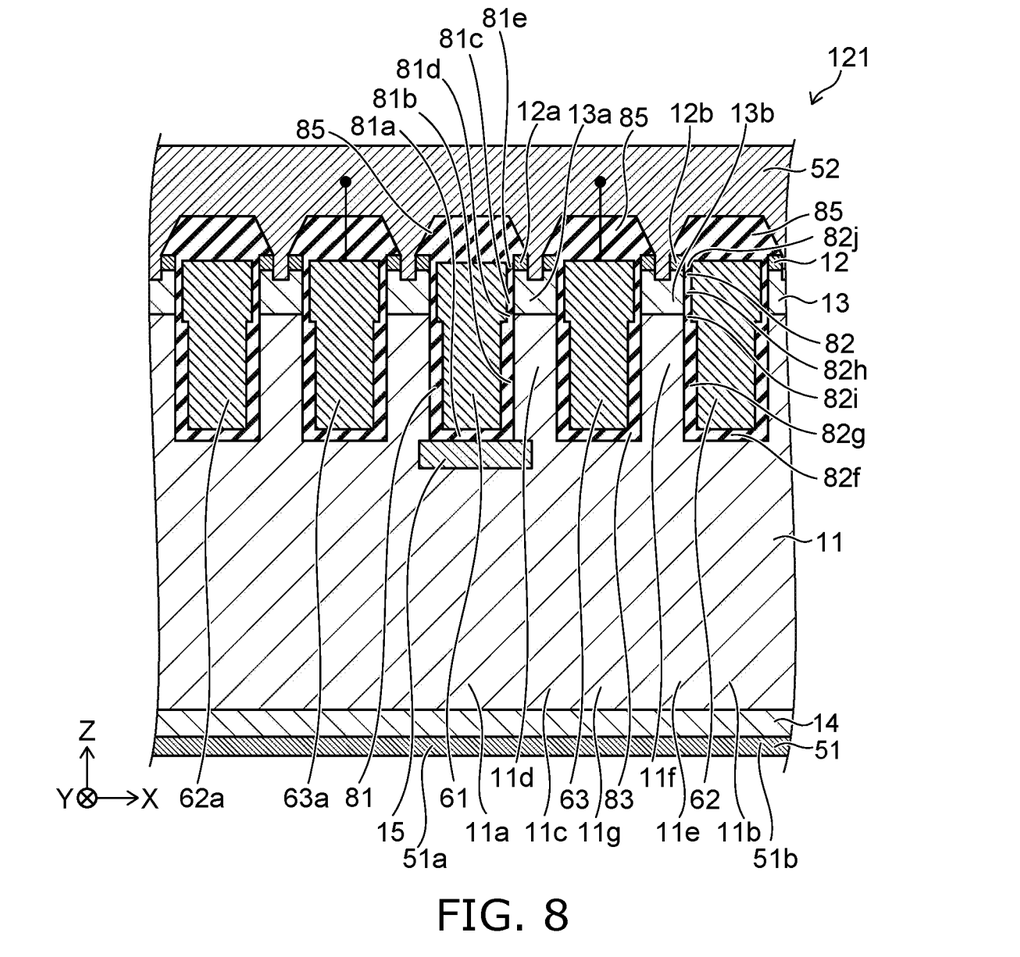
FIG. 8 is a schematic cross-sectional view illustrating a semiconductor device according to the second embodiment.

FIG. 8 is a schematic cross-sectional view illustrating a semiconductor device according to the second embodiment.

As shown in FIG. 8, the semiconductor device 121 according to the embodiment also includes the fifth semiconductor region 15. Otherwise, the configuration of the semiconductor device 121 is similar to the configuration of the semiconductor device 111. In the semiconductor device 121 as well, for example, the concentration of the electric field in the first insulating portion 81a can be relaxed. The degradation of the first insulating portion 81a can be suppressed. A semiconductor device can be provided in which stable operations are possible.

Figure 9:
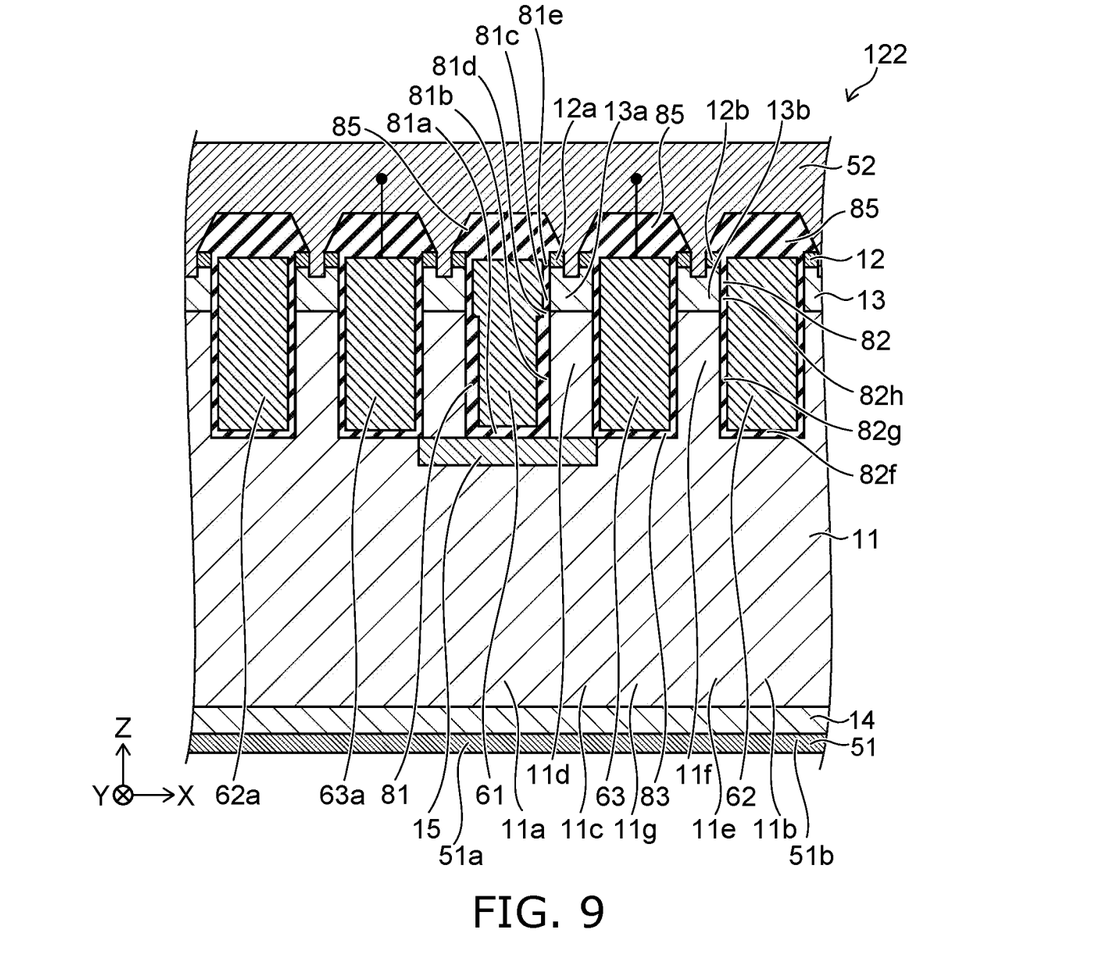
FIG. 9 is a schematic cross-sectional view illustrating a semiconductor device according to the second embodiment.

FIG. 9 is a schematic cross-sectional view illustrating a semiconductor device according to the second embodiment.

As shown in FIG. 9, the fifth semiconductor region 15 is provided in the semiconductor device 122 according to the embodiment as well. In the semiconductor device 122, a portion of the fifth semiconductor region 15 overlaps, in the Z-axis direction, at least a portion of the third insulating member 83 between the fourth partial region 11d and the third conductive member 63 next to the first conductive member 61. Otherwise, the configuration of the semiconductor device 122 is similar to the configuration of the semiconductor device 120.

Figure 10:
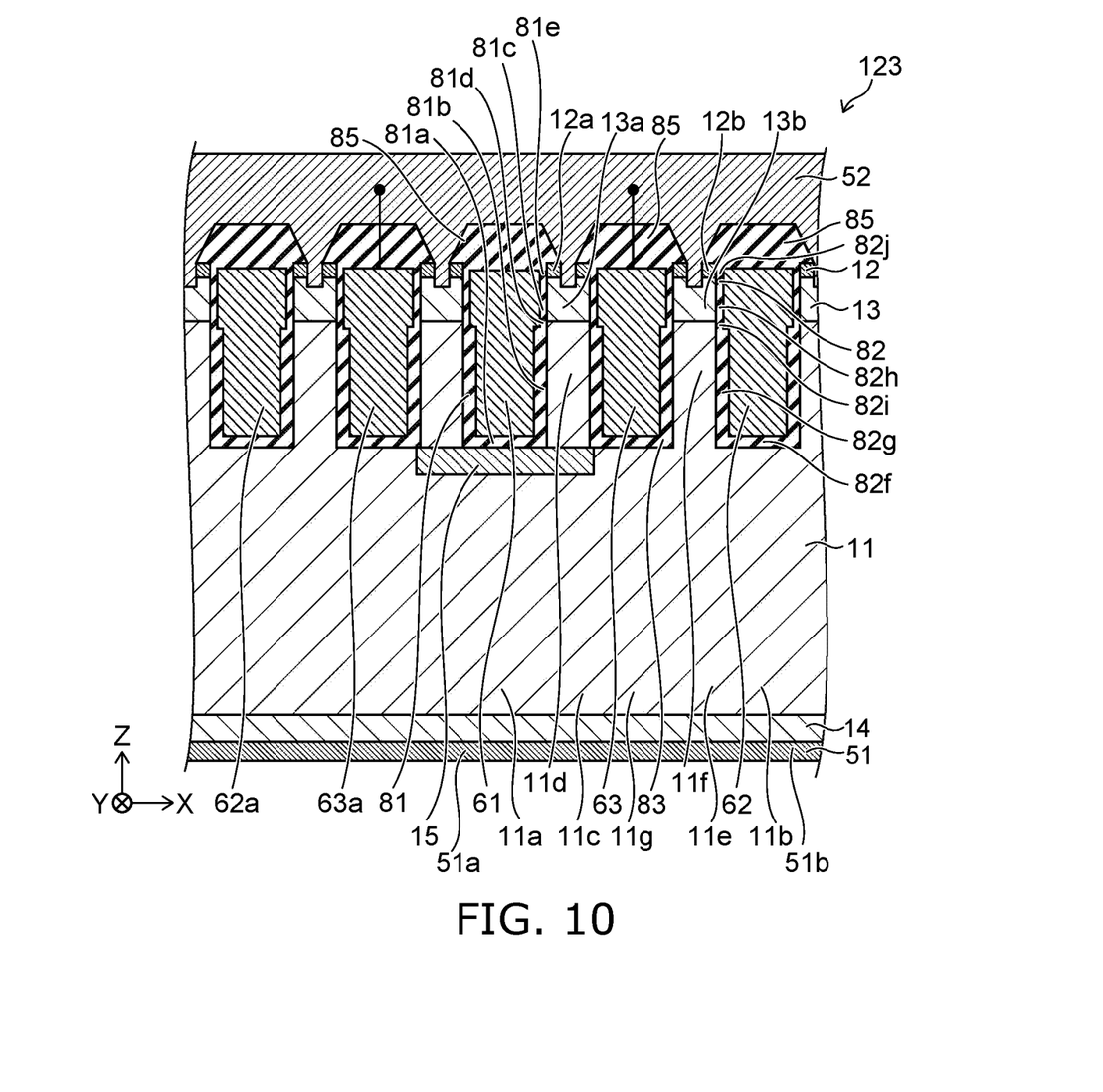
FIG. 10 is a schematic cross-sectional view illustrating a semiconductor device according to the second embodiment.

FIG. 10 is a schematic cross-sectional view illustrating a semiconductor device according to the second embodiment.

As shown in FIG. 10, the fifth semiconductor region 15 is provided in the semiconductor device 123 according to the embodiment as well. In the semiconductor device 123, a portion of the fifth semiconductor region 15 overlaps, in the Z-axis direction, at least a portion of the third insulating member 83 between the fourth partial region 11*d* and the third conductive member 63 next to the first conductive member 61. Otherwise, the configuration of the semiconductor device 123 is similar to the configuration of the semiconductor device 120.

In the semiconductor device 122 and the semiconductor device 123 as well, for example, the concentration of the electric field in the first insulating portion 81*a* can be relaxed. The degradation of the first insulating portion 81*a* can be suppressed. A semiconductor device can be provided in which stable operations are possible.

In the first and second embodiments, the semiconductor regions include silicon or a compound semiconductor (e.g., a nitride semiconductor, SiC, etc.). The insulating members and the insulating parts include at least one selected from the group consisting of silicon oxide, silicon nitride, silicon oxynitride, and aluminum oxide.

According to the embodiments, a semiconductor device can be provided in which stable operations are possible.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, conductive portions, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first conductive member;
   a second conductive member;
   a first electrode including a first electrode region and a second electrode region, a first direction from the first electrode region toward the first conductive member crossing a second direction from the first electrode region toward the second electrode region, a direction from the second electrode region toward the second conductive member being along the first direction;
   a first semiconductor region including a first partial region, a second partial region, a third partial region, and a fourth partial region, the first semiconductor region being of a first conductivity type, the first partial region being between the first electrode region and the first conductive member, the second partial region being between the second electrode region and the second conductive member, the third partial region being between the first partial region and the second partial region in the second direction, the third partial region being between the first electrode and the fourth partial region in the first direction, the fourth partial region being between the first conductive member and the second conductive member;
   a second semiconductor region including a first semiconductor film portion, the second semiconductor region being of the first conductivity type, the fourth partial region being between the third partial region and the first semiconductor film portion in the first direction;
   a third semiconductor region including a first semiconductor layer portion, the third semiconductor region being of a second conductivity type, the first semiconductor layer portion being between the fourth partial region and the first semiconductor film portion in the first direction;
   a fourth semiconductor region provided between the first electrode and the first semiconductor region, the fourth semiconductor region being of the second conductivity type;
   a fifth semiconductor region being of the second conductivity type, at least a portion of the fifth semiconductor region being provided between the first partial region and the first conductive member, the fifth semiconductor region being not provided between the second partial region and the second conductive member;
   a second electrode electrically connected to the first semiconductor film portion; and
   a first insulating member including a first insulating portion, a second insulating portion, a third insulating portion, a fourth insulating portion, and a sixth insulating portion, the first insulating portion being between the first partial region and the first conductive member in the first direction, the second insulating portion being between the first conductive member and the fourth partial region in the second direction, the third insulating portion being between the first conductive member and a portion of the first semiconductor layer portion in the second direction, the fourth insulating portion being between the first conductive member and an other another portion of the fourth partial region in the second direction, the fourth insulating portion being between the second insulating portion and the third insulating portion in the first direction, the sixth insulating portion being between the second partial region and the second conductive member in the first direction, the sixth insulating portion directly contacting the second partial region, a second thickness along the second direction of the second insulating portion being greater than a third thickness along the second direction of the third insulating portion, a fourth thickness along the second direction of the fourth insulating portion being greater than the third thickness.

2. The device according to claim 1, wherein
at least a portion of the fifth semiconductor region is between the third partial region and the fourth partial region in the first direction.

3. The device according to claim 1, wherein
a concentration of an impurity of the second conductivity type in the third semiconductor region is not less than $1\times10^{15}$ cm$^{-3}$ and not more than $1\times10^{15}$ cm$^{-3}$,
a concentration of the impurity of the second conductivity type in the fourth semiconductor region is not less than $1\times10^{16}$ cm$^{-3}$ and not more than $1\times10^{19}$ cm$^{-3}$, and
a concentration of the impurity of the second conductivity type in the fifth semiconductor region is not less than $1\times10^{13}$ cm$^{-3}$ and not more than $1\times10^{16}$ cm$^{-3}$.

4. The device according to claim 1, further comprising: a second insulating member,
a portion of the second insulating member being between the second partial region and the second conductive member in the first direction and contacting the second partial region.

5. The device according to claim 1, wherein
the second thickness is not less than 1.2 times the third thickness, and
the fourth thickness is not less than 1.2 times the third thickness.

6. The device according to claim 1, wherein
the first semiconductor region further includes a fifth partial region and a sixth partial region,
the fifth partial region is between the third partial region and the second partial region in the second direction,
the second semiconductor region further includes a second semiconductor film portion,
the third semiconductor region further includes a second semiconductor layer portion,
the sixth partial region is between the fifth partial region and the second semiconductor film portion in the first direction, the second semiconductor layer portion is between the sixth partial region and the second semiconductor film portion in
the first direction,
the sixth partial region is between the fourth partial region and a portion of the second conductive member in the second direction,
the second semiconductor layer portion is between the first semiconductor layer portion and a portion of the second conductive member in the second direction, and
the second semiconductor film portion is between the first semiconductor film portion and another portion of the second conductive member in the second direction.

7. The device according to claim 6, further comprising:
a second insulating member,
the second insulating member including a seventh insulating portion, and an eighth insulating portion,
the seventh insulating portion being between the second conductive member and at least a portion of the sixth partial region in the second direction,
the eighth insulating portion being between the second semiconductor layer portion and the second conductive member in the second direction.

8. The device according to claim 7, wherein
the second insulating member further includes a ninth insulating portion, the ninth insulating portion is between the seventh insulating portion and the eighth insulating portion in the first direction,
the ninth insulating portion is between the second conductive member and a portion of the sixth partial region in the second direction,
a seventh thickness along the second direction of the
seventh insulating portion is greater than an eighth thickness along the second direction of the eighth insulating portion, and a ninth thickness along the second direction of the ninth insulating portion is greater than the eighth thickness.

9. The device according to claim 8, wherein
a sixth thickness along the first direction of the sixth insulating portion is greater than the eighth thickness.

10. The device according to claim 7, wherein
the second insulating member further includes a tenth insulating portion, and
the tenth insulating portion is between the second semiconductor film portion and the second conductive member.

11. The device according to claim 7, further comprising:
a third conductive member electrically connected to the second electrode; and
a third insulating member,
the first semiconductor region further including a seventh partial region,
the seventh partial region being between the third partial region and the fifth partial region in the second direction,
a direction from the seventh partial region toward the third conductive member being along the first direction,
at least a portion of the third insulating member being between the seventh partial region and the third conductive member.

12. The device according to claim 11, wherein
the third conductive member is between the fourth partial region and the sixth partial region in the second direction, between the first semiconductor layer portion and the second semiconductor layer portion in the second direction, and between the first semiconductor film portion and the second semiconductor film portion in the second direction.

13. The device according to claim 1, wherein
a first thickness along the first direction of the first insulating portion is greater than the third thickness.

14. The device according to claim 13, wherein
the first thickness is not less than 1.2 times the third thickness.

15. The device according to claim 1, wherein
the first insulating member further includes a fifth insulating portion, and
the fifth insulating portion is between the first conductive member and the first semiconductor film portion.

16. The device according to claim 1, wherein
a concentration of an impurity of the first conductivity type in the second semiconductor region is greater than a concentration of the impurity of the first conductivity type in the first semiconductor region.

* * * * *

UNITED STATES PATENT AND TRADEMARK OFFICE
CERTIFICATE OF CORRECTION

PATENT NO. : 11,682,719 B2
APPLICATION NO. : 17/155523
DATED : June 20, 2023
INVENTOR(S) : Takahiro Kato et al.

It is certified that error appears in the above-identified patent and that said Letters Patent is hereby corrected as shown below:

In the Claims

In Claim 1, Column 12, Lines 54-55, "member and an other another portion" should read --member and another portion--.

In Claim 3, Column 13, Line 8, "not more than $1\times10^{15}$ cm$^{-3}$," should read --not more than $1\times10^{18}$ cm$^{-3}$,--.

Signed and Sealed this
Nineteenth Day of September, 2023

Katherine Kelly Vidal
*Director of the United States Patent and Trademark Office*